US010341017B1

(12) United States Patent
McElveen et al.

(10) Patent No.: US 10,341,017 B1
(45) Date of Patent: Jul. 2, 2019

(54) VISUAL LIGHT AUDIO TRANSMISSION SYSTEM

(71) Applicant: Wave Sciences, LLC, Charleston, SC (US)

(72) Inventors: James Keith McElveen, Charleston, SC (US); Noah I. Schiffman, Charleston, SC (US); David C. Kroop, West Friendship, MD (US)

(73) Assignee: Wave Sciences, LLC, Charleston, SC (US)

( * ) Notice: Subject to any disclaimer, the term of this patent is extended or adjusted under 35 U.S.C. 154(b) by 0 days.

(21) Appl. No.: 15/958,938

(22) Filed: Apr. 20, 2018

(51) Int. Cl.
*H04B 10/116* (2013.01)
*H03G 3/30* (2006.01)
*H04N 21/439* (2011.01)

(52) U.S. Cl.
CPC ......... *H04B 10/116* (2013.01); *H03G 3/3084* (2013.01); *H04N 21/4398* (2013.01)

(58) Field of Classification Search
CPC . H04B 10/116; H03G 3/3084; H04N 21/4398
USPC ........................................................ 398/118
See application file for complete search history.

(56) References Cited

U.S. PATENT DOCUMENTS

| 5,095,382 | A | * | 3/1992 | Abe | H04B 10/114 320/107 |
| 5,745,582 | A | * | 4/1998 | Shimpuku | H04L 1/0042 381/105 |
| 6,614,126 | B1 | * | 9/2003 | Mitchell | H04B 10/1149 307/9.1 |
| 6,683,590 | B1 | * | 1/2004 | Pang | G06F 3/147 340/815.45 |
| 2007/0263846 | A1 | * | 11/2007 | Fratti | H04M 3/56 379/388.03 |
| 2008/0310850 | A1 | * | 12/2008 | Pederson | G07C 9/00158 398/135 |
| 2016/0149645 | A1 | * | 5/2016 | Liu | H04B 10/40 398/135 |

* cited by examiner

*Primary Examiner* — Dalzid E Singh
(74) *Attorney, Agent, or Firm* — Gregory Finch; Finch Paolino, LLC

(57) ABSTRACT

A visible light audio system is operable to enable free space optical communication of audio signals via transmission of modulated light intensity at a light source to a photo diode being operably engaged with a demodulator and audio output device. Embodiments of the visible light audio system may be utilized, for example, in commercial, residential, or church buildings to transmit audio signals to occupants via the overhead lighting of the building. Embodiments of the present disclosure may be utilized in any commercial application where line of sight transmission of an audio signal is required or beneficial for occupants of an interior structure to receive a location-specific audio message.

18 Claims, 9 Drawing Sheets

VISUAL LIGHT AUDIO TRANSMISSION SYSTEM

FIELD

The present invention is in the technical field of data communication systems. More particularly, the present invention is in the technical field of free space optical data communication systems. The present invention relates to a communication system that utilizes free space optical signaling and whose transmitting component is installed in a conventional lighting system.

BACKGROUND

It is well known that a light beam can be varied in intensity to produce a signal containing information within the amplitude modulation. Furthermore, telecommunications systems rely upon modulating the wavelengths of the light signals in fiber optics, to impart data onto the light beam. Furthermore, it has been shown that a fluorescent light source can be used as a one-way communications device (Dachs, U.S. Pat. No. 3,900,404, Aug. 19, 1975) for voice communications using an external modulated signal imparted upon the lamp's AC current in an amplitude modulation scheme.

The inherent weakness in this system (Dachs) is the fact that the observed light flickers as a function of the audio signal's intensity. For many applications, this is an unacceptable solution. Subsequent publications and inventions have conceived different modulation techniques such as pulse code modulation and timing modulation and have adapted the encoding techniques for applications that require greater data bandwidths with mixed data types (Leeb, et al, U.S. Pat. No. 6,794,831, Sep. 21, 2004); however, these designs are complex and require a greater amount of power, circuitry, and cost to accomplish.

Through applied effort, ingenuity, and innovation, Applicant has identified a number of deficiencies and problems with visible light modulation and demodulation systems. Applicant has developed a solution that is embodied by the present invention, which is described in detail below.

SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

Several objects and advantages of the present invention are:

(a) to allow construction of an optical communication system whose transmitter simultaneously functions as a lighting device;

(b) to allow construction of said optical communication system and light device which operates without flicker or other effects upon the light that could be annoying or even noticeable to a casual observer;

(c) to allow construction of a communication system without the use of radio signals which may interfere with other electronic equipment or systems;

(d) to allow construction of a power efficient, localized one- or two-way communications in outdoor or indoor environments;

(e) to allow construction of said optical communication system which has minimal cost of manufacture for both the transmitter and receiver;

(f) to allow construction of said optical communication system whose transmitter can be adapted to a wide variety of residential or commercial building light bulbs; and (g) to allow construction of a communications system that is contained by means of simple barriers that are opaque at the optical frequencies of interest.

Another object of the present disclosure is visible light audio system comprising a visible light transmitting apparatus comprising an audio compressor or limiter, a voltage controlled oscillator, a half bridge driver, at least one switching transistor, a ballast circuit, and a light source, the visible light transmitting apparatus being operable to receive an audio source input at the audio compressor or limiter and being operable to transmit a modulated light intensity at the light source; a headband having a plurality of photo diodes disposed on an upper surface of the headband, the plurality of photo diodes comprising a photo detector array, the photo detector array being operable to receive the modulated light intensity and convert the modulated light intensity into an electrical signal; a demodulation device being operably engaged with the photo detector array to receive the modulated frequency via a system bus, the demodulation device being operable to demodulate the electrical signal to produce an audio output corresponding to the audio source input; and, an audio output device being operably engaged with the demodulation device to deliver an audio output, the audio output device comprising one or more speakers or ear pieces.

Yet another object of the present disclosure is a visible light audio system comprising a visible light transmitting apparatus comprising an audio compressor or limiter, a voltage controlled oscillator, a half bridge driver, at least one switching transistor, a ballast circuit, and a light source, the visible light transmitting apparatus being operable to receive an audio source input at the audio compressor or limiter and being operable to transmit a modulated light intensity at the light source; a headband having a plurality of apertures disposed on an upper surface of the headband, the plurality of apertures defining terminal ends of a plurality of photo detectors operably engaged with at least one photo detector amplifier, the at least one photo detector amplifier being operable to receive the modulated light intensity and convert the modulated light into an electrical signal; a demodulation device being operably engaged with the at least one photo detector to receive the electrical signal via a system bus, the demodulation device being operable to demodulate the electrical signal to produce an audio output corresponding to the audio source input; and, an audio output device being operably engaged with the demodulation device to deliver an audio output, the audio output device comprising one or more speakers.

Still another object of the present disclosure is a visible light audio system comprising a visible light transmitting apparatus comprising an audio compressor or limiter, a voltage controlled oscillator, a half bridge driver, at least one switching transistor, a ballast circuit, and a light source, the visible light transmitting apparatus being operable to receive an audio source input at the audio compressor or limiter and being operable to transmit at least one modulated light intensity at the light source; a body-worn receiver having at least one photo detector disposed on a surface of the body-worn receiver, photo detector being operable to receive the modulated light intensity and convert the modulated light intensity into an electrical signal; a demodulation device being operably engaged with the at least one photo detector to receive the electrical signal via a system bus, the demodulation device being operable to demodulate the electrical signal to produce an audio output corresponding to the compressed audio source input; and, an audio output device being operably engaged with the demodulation device to deliver an audio output, the audio output device comprising one or more speakers or ear pieces.

The foregoing has outlined rather broadly the more pertinent and important features of the present invention so that the detailed description of the invention that follows may be better understood and so that the present contribution to the art can be more fully appreciated. Additional features of the invention will be described hereinafter which form the subject of the claims of the invention. It should be appreciated by those skilled in the art that the conception and the disclosed specific methods and structures may be readily utilized as a basis for modifying or designing other structures for carrying out the same purposes of the present invention. It should be realized by those skilled in the art that such equivalent structures do not depart from the spirit and scope of the invention as set forth in the appended claims.

The figures form a part of the invention disclosure and are used to illustrate embodiments but not to limit the scope of the claims to that embodiment. In the following, the invention will be described in more detail with reference to the drawing, where:

DETAILED DESCRIPTION OF THE INVENTION

Figure 1:
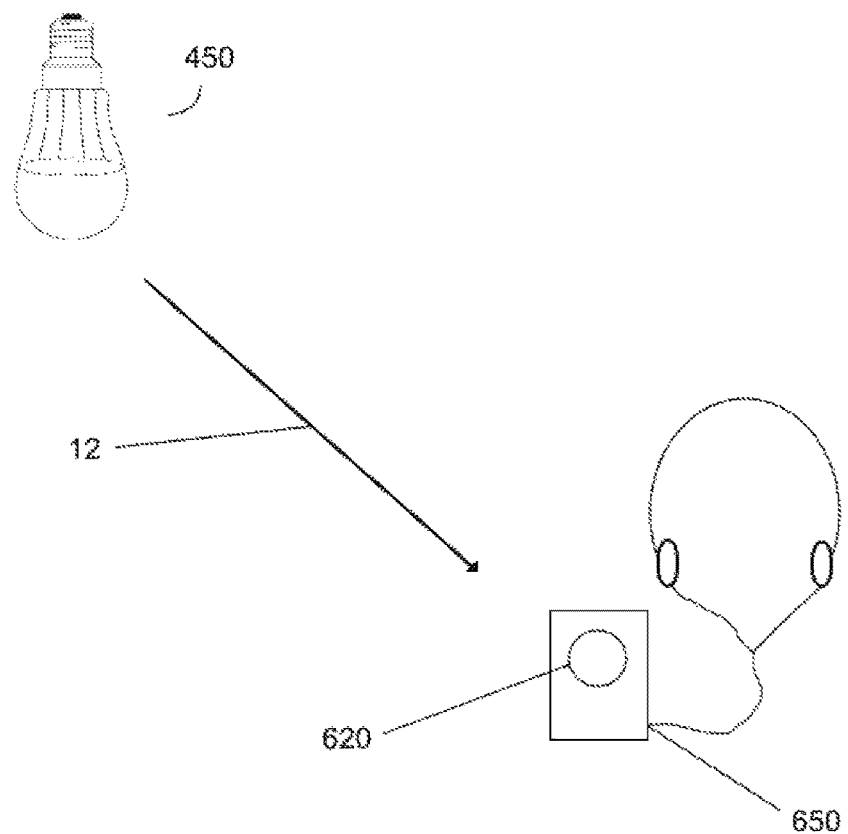
FIG. 1 is a system diagram of an embodiment of the present disclosure.

Referring now to the invention in more detail, FIG. 1 is a system diagram of an embodiment of the invention. In more detail, still referring to the invention of FIG. 1, a transmitting device 450 is operable to receive a signal of interest and modulate an operating frequency in response to the signal of interest. In a preferred embodiment, the signal of interest is an audio signal, and the modulated operating frequency is transmitted as visible light. Modulated operating frequency from transmitter 450 may travel to a receiver 650 via a free space optical path 12. In a preferred embodiment, the modulated operating frequency may be received by a photo detector 620, which may be operable to produce a signal that is demodulated by receiver 650 to reproduce the audio signal modulated by transmitter 450.

Figure 2:
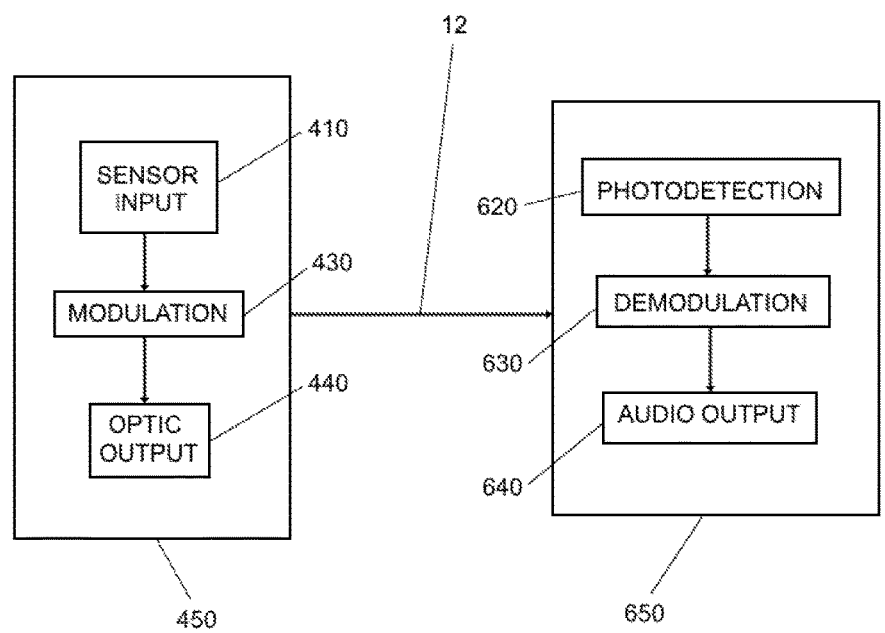
FIG. 2 is a functional block diagram of an embodiment of the system of this invention.

Referring now to the invention in more detail, FIG. 2 is a functional block diagram of an embodiment of the system of this invention. In more detail, still referring to the invention of FIG. 2, a transmitting device 450 is operable to receive a signal of interest via a sensor input 410. In a preferred embodiment, the signal of interest is an audio signal. The audio signal may be modulated by a modulator 430, whereby modulator 430 converts the audio signal to a modulated operating frequency. An optic output 440 is operable to transmit the modulated operating frequency as an electromagnetic frequency; in a preferred embodiment, the electromagnetic frequency is emitted as visible light.

Modulated operating frequency emitted from transmitter 450 may travel to a receiver 650 via a free space optical path 12. In a preferred embodiment, the modulated operating frequency may be received by a photodetector 620. The modulated operating frequency received by photodetector 620 may be communicated to a demodulator 630. Demodulator 630 may be operable to convert the electromagnetic modulated operating frequency to a demodulated frequency. In a preferred embodiment, the demodulated frequency is converted to an audio signal by audio output 640, wherein the audio signal is of substantially the same frequency as that of the original audio signal received by sensor input 410.

Figure 3:
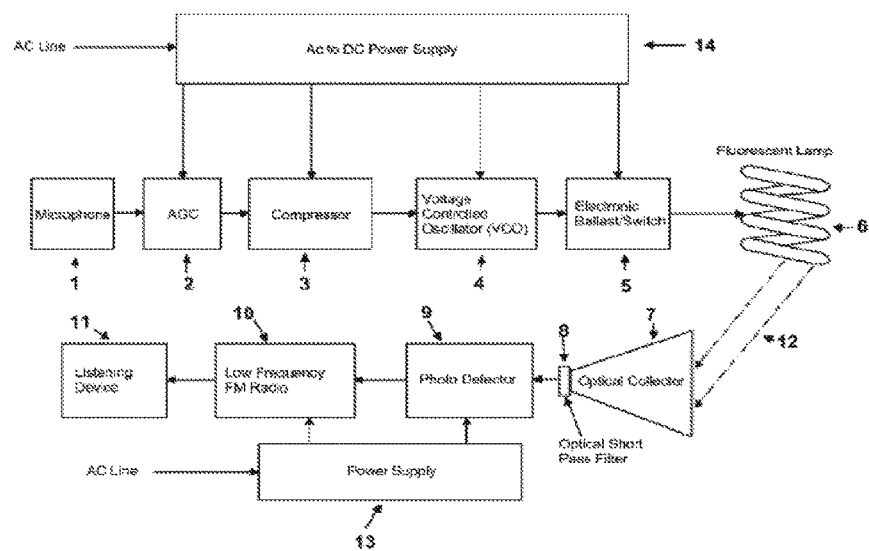
FIG. 3 is a functional block diagram of an embodiment of the system of this invention, illustrating functional component processes of a transmitter and receiver.

Referring now to the invention in more detail, in FIG. 3 there is shown a functional system block diagram of an embodiment of the invention. In more detail, still referring to the invention of FIG. 3, the transmitting device may consist of a compact fluorescent lamp (CFL) 6 whose operating electronic ballast 5 has been modified to allow modulation of its operating frequency by a signal of interest. The front end of the receiver side consists of an optical collection system made up of an optical collector (i.e. a lens subsystem) 7, a filter 8, and a photo-detector 9. In the embodiment, the signal of interest is audio collected on the transmit side by a microphone 1 and on the receive side the photo-detector 9 produces a signal that is demodulated by a low carrier frequency, frequency modulation (FM) radio 21 to reproduce the original audio signal.

The construction details of the invention as shown in FIG. 3 will now be discussed. The transmitting part of the system consists of a microphone 1 coupled to an automatic gain controlled (AGC) amplifier 2 to adjust for audio signal levels at the microphone 1, and an audio compressor 3 which maintains a constant current level being fed to the voltage controlled oscillator (VCO) 4, and ballast 5, thus avoiding sudden changes in the audio signal causing the fluorescent lamp to flicker. AGC amplifier 2 and compressor 3 could be combined as a dynamic range control (DRC) step. DRC may further include an expansion step, in addition to compressing and limiting. VCO 4 provides the operating frequency for the electronic switch and ballast 5 that operates the fluorescent lamp tube 6. Power for the electronic circuits is via an AC to DC converter 13. Light from the transmitter travels to the receiver along a free space optical path 12. VCO 4 is a design choice to perform the function of modulation, and could be readily substituted for other hardware/software/circuitry solutions for modulation.

The receiver section of the system consists of optical collector 7 coupled to a short pass filter 8 to reduce infrared interference, and a focusing lens on the front of the photo-detector (not shown). The use of the front optical collector 7 provides additional signal to the receiver. The blue enhanced photo-detector 9 collects light over the visible and near UV wavelengths. The short pass filter 8 blocks infrared light, in order to minimize the ambient light interference. An optional UV blocking filter can also be inserted into the optical chain to minimize ambient light interference. The photo-detector 9 converts the transmitter's frequency modulated light into an electrical signal. The output of the photo-detector 9 is feed into a low frequency FM demodulator 10 for recovery of the audio signal. The FM demodulator 10 is tuned to the center frequency of the VCO 4 in the transmitter for optimum performance. FM demodulator 10 is a design choice to perform the function of demodulation, and could be readily substituted for other hardware/software/circuitry solutions for demodulation. The output of the FM demodulator 10 is fed to the listening device 11 such as a head set or speaker. Power for the receiver is via a standard AC to DC power supply 13.

Other variations on this construction technique include replacement of the transmitter's CFL bulb with an LED (Light Emitting Diode) or HID (High Intensity Discharge) lamp; replacement of the modulation technique with another frequency-based type, such as FSK (Frequency Shift Keying), for transmission of digital data.

Figure 4:
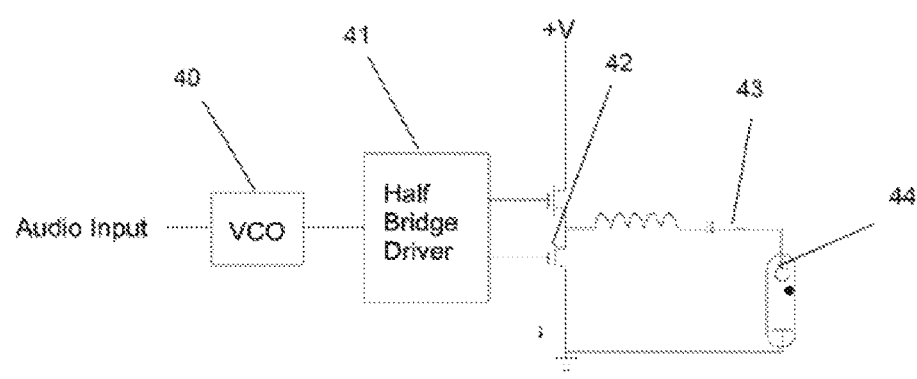
FIG. 4 is a schematic diagram of an optical communication system's transmitter in an embodiment of the invention.

Referring now to the invention shown in FIG. 4, there is shown the schematic diagram of an embodiment of the transmitter's ballast modulation circuitry.

In more detail, still referring to the invention of FIG. 4, there is shown the voltage controlled oscillator (VCO) 40, half bridge driver 41, switching transistors 42, ballast circuit 43, and fluorescent lamp bulb circuitry that comprise the means for modulation and transmission of the optical communications in the embodiment of the invention.

The construction details of the invention as shown in FIG. 4 are, in an embodiment, represents the relationship of the VCO 40, half bridge driver 41, switching transistors 42, ballast circuit 43, and lamp 6 (FIG. 3). The ballast circuit 43 consists of an inductor and capacitor in a resonant circuit. The operating point on the resonant circuit's response curve determines the current through the lamp 6. As the frequency changes, the current changes based upon the response curve's operating point. Small shifts in frequency only cause small current changes, hence small light output changes. Sudden large changes cause large current changes, and can turn the lamp 6 off if excessive, or cause a noticeable flicker.

Other variations on this construction technique have been conceived and prototyped by one or more of the inventors, including but not limited to incorporation of other styles of fluorescent and high intensity discharge lighting devices. For example, in an alternative embodiment where the light source is comprised of one or more light emitting diodes (LEDs) rather than a compact fluorescent tube, the bulb circuitry would vary from that shown in FIG. 4. In such an embodiment, the half bridge driver 41 and ballast circuit 43 may be substituted for a series resistor and parallel field-effect transistors (FET). Other commercially viable circuitry and/or hardware configurations and/or combinations are anticipated, provided such combinations are operable to enable sufficient modulation of the light intensity at the light source, as described herein.

Figure 5:
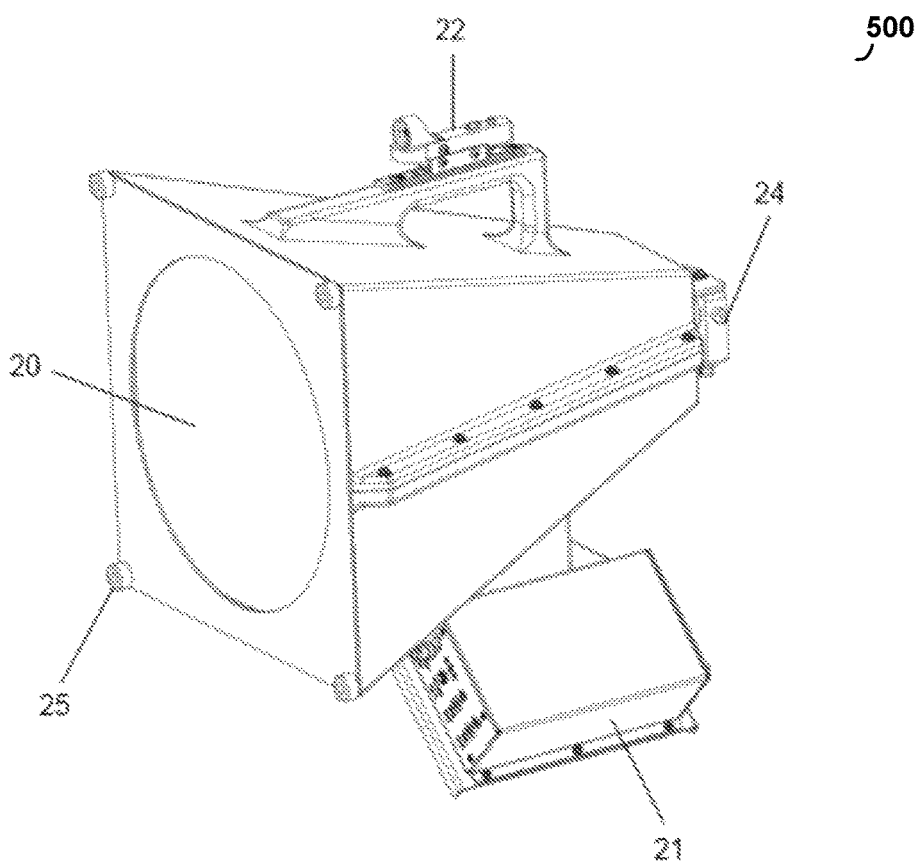
FIG. 5 is an illustration of the optical communication system's receiver in an embodiment of the invention.

Referring now to the invention shown in FIG. 5, there is shown an illustration of a receiver assembly of an embodiment of the invention.

In more detail, still referring to the invention of FIG. 5 there is shown an optical collector 500 generally comprised of a Fresnel lens 20, spotting sight 22, photo-detector with amplifier 24, protective bumpers 25, and FM demodulator with audio output 21.

The construction details of the invention as shown in FIG. 5 are, in an embodiment, an optical collector 500 constructed using a Fresnel lens 20 which is focused down to the front end of the photo-detector 24 which has a gain adjustment (not shown). The spotting sight 22 is used to assist in alignment in both bearing and elevation when the system is used over a long distance and is removable when not needed for operation and in shipment. The output of the photo-detector 24 is cabled to the input of the FM demodulator 21 which has a peak finder circuit and provides both audible (through headphone output) and visual (through light emitting diode) indicators to assist the user in determining when the steering alignment has been maximized for signal strength. The FM demodulator 21 includes software to track any frequency drift that may occur in the transmitter's frequency. The FM demodulator 21 also outputs the demodulated audio at line, microphone, and line levels so that the user may reproduce the received audio on a loudspeaker, headset, or similar device, as well as transmit or record the received audio. Optical collector 500 as shown and described in FIG. 5 is merely illustrative of an embodiment of an optical collector utilized by the present invention. Numerous alternative embodiments of optical collector 500 are anticipated. The size and configuration of optical collector 500 will vary depending on the distance from which the optical collector needs to collect the modulated light intensity from the light source; i.e. the lens of optical received 500 functions as a directional gain, so for short distances the optical collector may be lens-less. For example, in a body-worn embodiment (as further described in FIGS. 7-9) the optical collector may be configured as one or more photo diodes or avalanche photo diodes (APD) disposed on a headband or other body-worn device. In certain embodiments, the optical collector may even be configured as a camera lens on a smart phone.

Other variations on this construction technique have been conceived or prototyped by the inventor, including but not limited to replacement of the receiver's Fresnel lens with other optics, such as a spotting scope or telescope; removal of the receiver's lens completely for short range links where the received signal is very strong; use of wireless connections instead of cabling at the receiver; replacement of the receiver's photo-detector with a photo-multiplier tube or similar device; replacement of the demodulation technique with another frequency-based type, such as FSK (Frequency Shift Keying), for demodulation of digital data; and the replacement of the digital FM demodulator circuitry with an analog equivalent.

Figure 6:
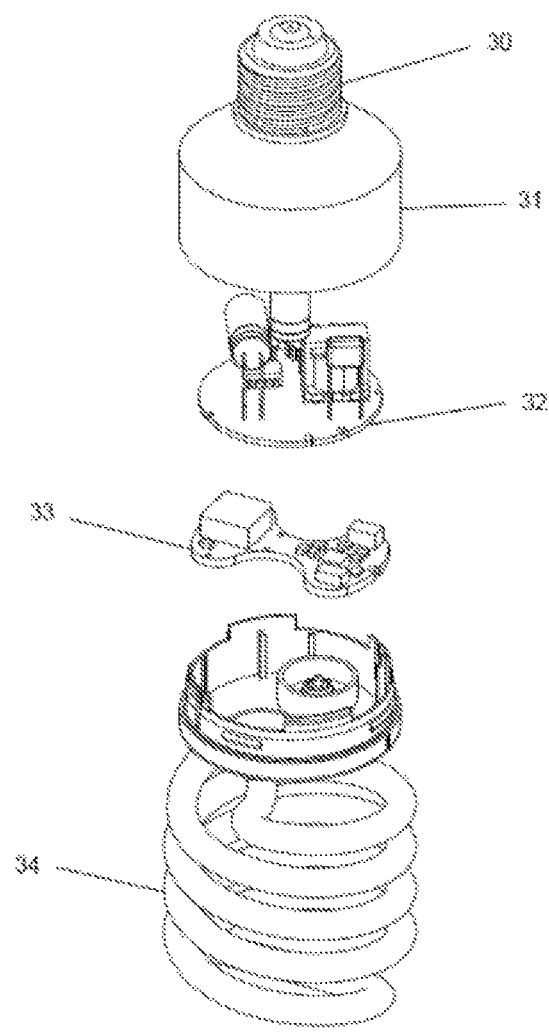
FIG. 6 is a cut-away of an embodiment of the invention illustrating the construction of a fluorescent lamp bulb transmitter.

Referring now to the invention shown in FIG. 6, there is shown a cut-away of an embodiment of the invention illustrating the construction of a compact fluorescent lamp bulb transmitter.

In more detail, still referring to the invention of FIG. 6, there is shown the screw 30, lamp base 31, lamp ballast circuit 32, microphone and modulator board 33, and fluorescent tube 34.

The construction details of the invention as shown in FIG. 6 are, in an embodiment, a commercial-off-the-shelf compact fluorescent lamp with the microphone and modulator board 33 added in the electrical circuit in order to modulate the ballast refresh rate. Other variations on this construction technique have been conceived or prototyped by the inventor, including but not limited to other fluorescent tubes and gas discharge devices; alternative modulator circuit designs; and other fluorescent lamps of various sizes and form factors.

The advantages of the present invention include, without limitation, (a) The transmitting apparatus provides a means of collecting audio or other data and transmitting it to a remote location via a free space optical signal;
(b) The transmitting apparatus utilizes a commonly available style CFL or LED bulb frequently used in residential and commercial buildings, modified to act as an optical transmitter, while providing functional operation of the apparatus as a lighting device;
(c) The design of the apparatus allows it to be deeply integrated into other electrical/electronic devices and commonly available building components and accessories;
(d) The successful operation of the apparatus does not require direct line of sight, merely the observance of the direct, diffuse, refracted, or reflected light, thus providing greater flexibility in the installation and operation of the device;
(e) The operating frequency of the system provides immunity from most outside electromagnetic and optical interference sources at the receiver and is only limited by the ballast design parameters, thus changes in these parameters will allow for changes in the operating frequency;
(f) Utilization of an optical transmission signal avoids the dangers associated with radio frequency signals in sensitive areas such as law enforcement applications, medical radiology centers, and chemical manufacturing areas;
(g) The data modulation apparatus utilizes compression circuitry to limit any sudden changes in its output signal that may result from sudden changes in its input signal, thus maintaining a constant lamp drive current and illumination;
(h) The design compensates for lamp current variations through use of the compressor circuit and voltage controlled oscillator, caused by the inherent nature of the ballast components that are frequency sensitive, hence can cause lamp light flicker from large input signals;
(i) The CFL light source can be changed to other gas discharge and solid state lighting systems, including ultraviolet, infrared, and light emitting diode (LED) sources to provide the same capabilities as the current embodiment; and
(j) The simplicity of the design provides low cost of manufacture, ease of installation, and high reliability.

There are numerous applications that could benefit from the present invention, including airports, the meat packing industry, oil/gas industry, medical radiology centers, chemical plants involved with explosive materials, libraries and museums, and law enforcement.

In broad embodiment, the present invention is a communication system that utilizes free space optical signaling and whose transmitting component is installed in a conventional lighting system, based on CFL, LED, gas discharge, or similar technologies, which incorporate a refresh rate.

Figure 7:
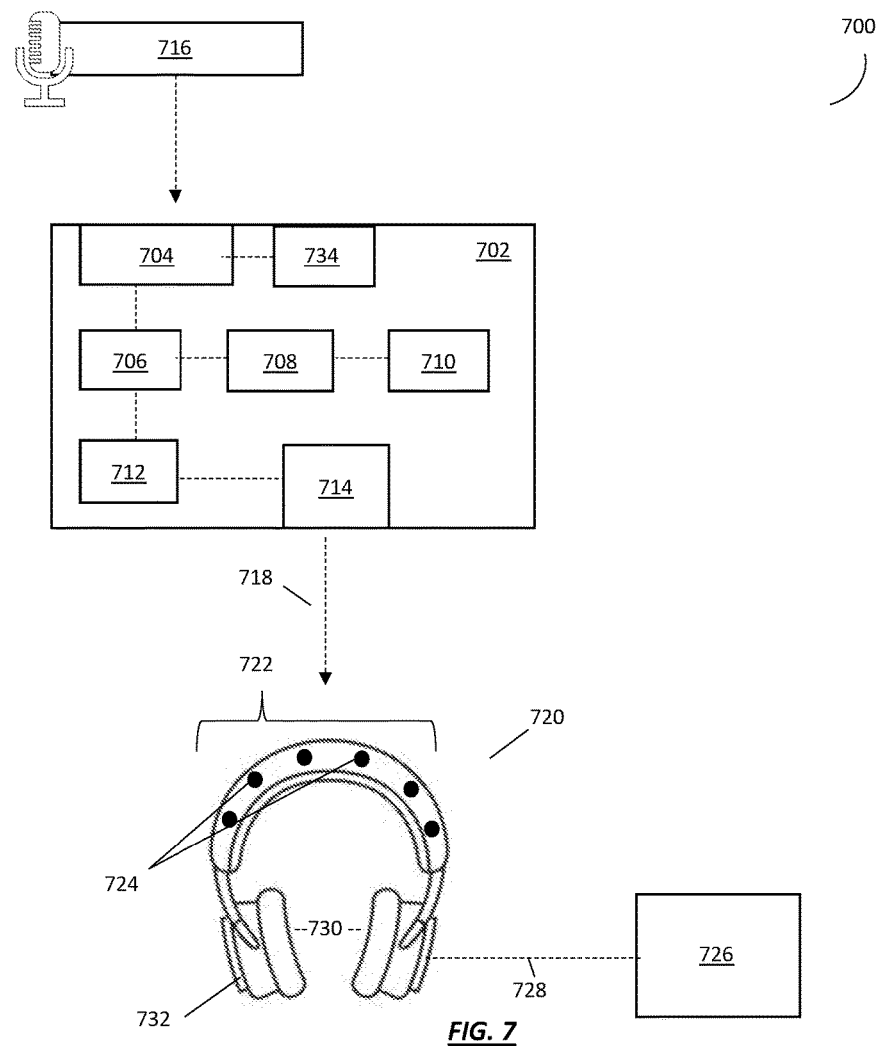
FIG. 7 is a functional block diagram of a visible light audio system, according to an embodiment of the present disclosure.
Figure 8:
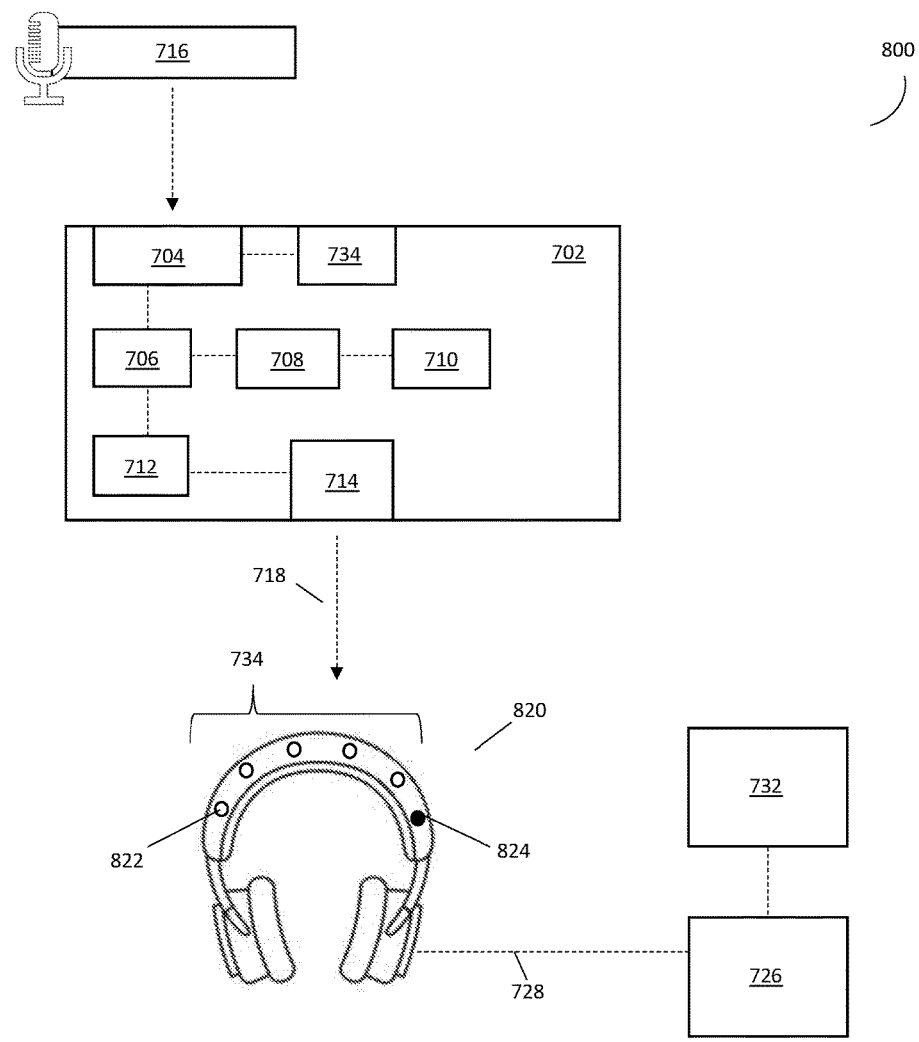
FIG. 8 is a functional block diagram of a visible light audio system, according to an embodiment of the present disclosure; and, FIG. 9 is a functional block diagram of a visible light audio system, according to an embodiment of the present disclosure.
Figure 9:
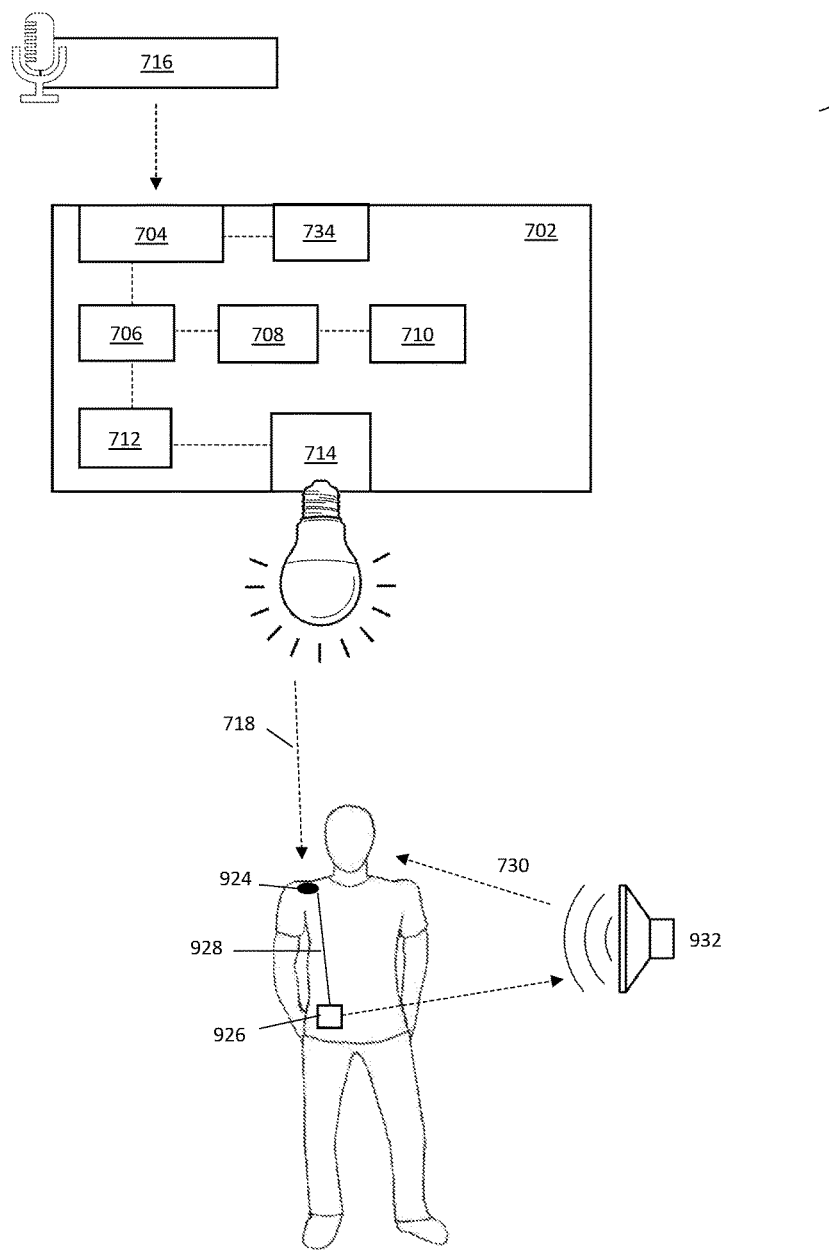

Referring now to FIGS. 7-9, a functional block diagram of a visible light audio system 700 is shown. According embodiments of the present disclosure, visible light audio system 700 is operable to enable free space optical communication of audio signals via transmission of modulated light intensity at a light source to a photo diode being operably engaged with a demodulator and audio output device. Embodiments of visible light audio system 700 may be utilized, for example, in commercial, residential, or church buildings to transmit audio signals to occupants via the overhead lighting of the building. Audio signals transmitted to occupants via the overhead lighting might include prerecorded messages or a telecommunications circuit; for example, in a hotel, the lighting in the lobby might communicate a message to an ear piece of a blind person that he or she is located in the lobby and the reception desk is 30 feet to their right. Alternatively, audio signals transmitted to occupants via the overhead lighting might include live messages; for example, a microphone input from an individual addressing an audience, where the lighting will communicate such the microphone input to a photo diode worn by a hearing impaired individual to enable amplification of the audio to an assistive listening device. Embodiments of the present disclosure may be utilized in any commercial application where line of sight transmission of an audio signal is required or beneficial for occupants of an interior structure to receive a location-specific audio message.

Referring now to FIG. 7, according to an embodiment of the present disclosure a visible light audio system 700 is generally comprised of a visible light transmitting apparatus 702, a headband 720 having one or more photo diodes, a demodulation device 726, and an audio output device 732. Visible light transmitting apparatus 702 may be generally comprised of an audio compressor or limiter 704, a voltage controlled oscillator 706, a half bridge driver 708, at least one switching transistor 710, a ballast circuit 712, and a light source 714. Light source 714 may consist of one or more compact fluorescent light bulbs, one or more light emitting diodes, one or more LED bulbs, and one or more high intensity discharge lamps. As discussed above, embodiments where the light source 714 is comprised of one or more light emitting diodes (LEDs) rather than a compact fluorescent tube, half bridge driver 708 and ballast circuit 712 may be substituted for a series resistor and parallel field-effect transistors (FET). Visible light transmitting apparatus 702 may further comprise a battery to serve as a backup power source in the event of a power outage. Visible light transmitting apparatus 702 is operable to receive an audio source input 716 at audio compressor or limiter 704. Audio compressor or limiter 704 is operable to compress the audio input for modulation. Voltage controlled oscillator 706, half bridge driver 708, switching transistor 710, and ballast circuit 712 are operable engaged with light source 714 to produce a modulated light intensity at light source 714 corresponding to the modulated audio input. Visible light transmitting apparatus 702 may further comprise an automatic gain controlled amplifier 734 operable engaged with audio compressor or limiter 704. Visible light audio system 700 may further comprise one or more microphones operably engaged with automatic gain controlled amplifier 734 for the transmission of a live audio source input 716 for modulation and transmission by visible light transmitting apparatus 702. Visible light transmitting apparatus 702 should be configured to be installed in a conventional, off-the-shelf lighting fixture. Visible light audio system 700 may be comprised of a plurality of visible light transmitting apparatuses 702 being installed in a commercial or residential dwelling and operably engaged over a network. In certain embodiments, visible light transmitting apparatus 702 may further comprise one or more photoreceptors disposed on a surface of the housing (i.e. bulb). Photoreceptors disposed on a surface of the housing of visible light transmitting apparatus 702 would enable visible light transmitting apparatus to also receive modulated light intensity as well as transmit a modulated light intensity at the light source; i.e. visible light transmitting apparatus 702 could function as a transceiver.

Still referring to FIG. 7 and according to an embodiment of the present disclosure, headband 720 has a plurality of photo diodes 724 disposed on an upper surface of headband 720. The plurality of photo diodes 724 define a photo detector array 722. Photo detector array 722 is operable to receive the modulated light intensity 718 and convert the modulated light intensity 718 into an electrical signal. Demodulation device 726 is operably engaged with photo detector array 722 to receive the modulated frequency via a system bus 728. Demodulation device 726 is operable to demodulate the electrical signal to produce an audio output 730 corresponding to audio source input 716. An audio output device 732 is operably engaged with demodulation device 726 to deliver audio output 730. Audio output device 732 may comprise one or more speakers or ear pieces. According to an embodiment, audio output device and headband comprise a set of headphones to be worn by a user.

Referring now to FIG. 8, a functional block diagram of a visible light audio system 800 is shown. According to an embodiment of the present disclosure, visible light audio system 800 is generally comprised of a visible light transmitting apparatus 702, a headband 820, a demodulation device 726, and an audio output device 732. According to the embodiment shown in FIG. 8, visible light transmitting apparatus 702 is of substantially the same form and function as described in FIG. 7 above. As shown in FIG. 8, headband 820 has a plurality of photomultiplier tubes 820 disposed on an upper surface of headband 820. The plurality of photomultiplier tubes 820 are disposed on the upper surface of headband 820 such that the terminal ends of a plurality of photomultiplier tubes 820 define a photomultiplier array 734. Photomultiplier tubes 820 are operably engaged with at least one photo detector amplifier 824 to deliver the modulated light intensity 718 to photo detector amplifier 824. Photo detector amplifier 824 is operable to receive modulated light intensity 718 and convert modulated light intensity 718 into an electrical signal containing the modulated frequency. Demodulation device 726 is operably engaged with photo detector amplifier 824 to receive the modulated frequency via a system bus 728. Demodulation device 726 is operable to demodulate the electrical signal to produce an audio output 730 corresponding to audio source input 716. An audio output device 732 is operably engaged with demodulation device 726 to deliver audio output 730. Audio output device 732 may comprise one or more speakers or ear pieces.

Referring now to FIG. 9, a functional block diagram of a visible light audio system 900 is shown. According to an embodiment of the present disclosure, visible light audio system 900 is generally comprised of a visible light transmitting apparatus 702, a body-worn receiver 924, a demodulation device 926, and an audio output device 932. According to the embodiment shown in FIG. 9, visible light transmitting apparatus 702 is of substantially the same form and function as described in FIG. 7 above. According to the embodiment shown in FIG. 9, body-worn receiver 924 is comprised of at least one photo detector disposed on a surface of body-worn receiver 924. The photo detector of body-worn receiver 924 is operable to receive modulated light intensity 718 and convert the modulated light intensity into an electrical signal containing the modulated frequency. Demodulation device 926 is operably engaged with body-worn receiver 924 to receive the modulated frequency via a system bus 928. Demodulation device 726 is operable to demodulate the electrical signal to produce an audio output 730 corresponding to audio source input 716. An audio output device 932 is operably engaged with demodulation device 926 to deliver audio output 730. Audio output device 932 may comprise one or more speakers or ear pieces.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

What is claimed is:

1. A visible light audio system comprising:
   a visible light transmitting apparatus comprising a modulator, a driver, and a light source, the visible light transmitting apparatus being operable to receive an audio source input and being operable to transmit a modulated visible light output corresponding to the audio source input at the light source, the audio source input comprising assistive information for at least one visually or hearing impaired user;
   a receiver comprising a headband having a plurality of photo diodes disposed on an upper surface of the headband, the plurality of photo diodes comprising a photo detector array, the photo detector array being operable to receive the modulated light intensity and convert the modulated light intensity into an electrical signal;
   a demodulation device being operably engaged with the photo detector array to receive the modulated frequency via a system bus, the demodulation device being operable to demodulate the electrical signal to produce an audio output corresponding to the audio source input; and,
   an audio output device being operably engaged with the demodulation device to deliver an audio output, the audio output device comprising one or more assistive listening devices or ear pieces.

2. The visible light audio system of claim 1 wherein the audio output device and the headband comprise a set of headphones.

3. The visible light audio system of claim 1 wherein the visible light transmitting apparatus further comprises an automatic gain controlled amplifier or dynamic range control means.

4. The visible light audio system of claim 3 wherein the visible light transmitting apparatus further comprises a microphone operably engaged with the automatic gain controlled amplifier or dynamic range control means.

5. The visible light audio system of claim 1 wherein the light source is selected from the group consisting of one or more compact fluorescent light bulbs, fluorescent tubes, one or more light emitting diodes, one or more LED bulbs, and one or more high intensity discharge lamps.

6. The visible light audio system of claim 1 wherein the audio source input comprises a prerecorded message or telecommunications circuit.

7. The visible light audio system of claim 6 further comprising a plurality of visible light transmitting apparatuses being installed in a commercial or residential dwelling, the plurality of visible light transmitting apparatuses being operably engaged over a network.

8. The visible light audio system of claim 7 wherein each visible light transmitting apparatus in the plurality of visible light transmitting apparatuses is configured to transmit a prerecorded message corresponding to a location in the commercial or residential dwelling.

9. A visible light audio system comprising:
a visible light transmitting apparatus comprising a modulator, a driver, and a light source, the visible light transmitting apparatus being operable to receive an audio source input and being operable to transmit a modulated visible light output corresponding to the audio source input at the light source;
a receiver comprising a headband having a plurality of apertures disposed on an upper surface of the headband, each aperture in the plurality of apertures defining a terminal end of each tube in a plurality of tubes, the plurality of tubes being operably engaged with at least one photo sensor, the at least one photo sensor being operable to receive the modulated visible light output and convert the modulated visible light output into an electrical signal;
a demodulation device being operably engaged with the at least one photo detector to receive the electrical signal via a system bus, the demodulation device being operable to demodulate the electrical signal to produce an audio output corresponding to the audio source input; and,
an audio output device being operably engaged with the demodulation device to deliver an audio output, the audio output device comprising one or more speakers.

10. The visible light audio system of claim 9 wherein the audio output device and the headband comprise a set of headphones.

11. The visible light audio system of claim 9 wherein the audio source input comprises a prerecorded message or telecommunications circuit.

12. The visible light audio system of claim 11 further comprising a plurality of visible light transmitting apparatuses being installed in a commercial or residential dwelling, the plurality of visible light transmitting apparatuses being operably engaged over a network.

13. The visible light audio system of claim 12 wherein each visible light transmitting apparatus in the plurality of visible light transmitting apparatuses is configured to transmit a prerecorded message corresponding to a location in the commercial or residential dwelling.

14. The visible light audio system of claim 9 wherein the light source is selected from the group consisting of one or more compact fluorescent light bulbs, fluorescent tubes, one or more light emitting diodes, one or more LED bulbs, and one or more high intensity discharge lamps.

15. A visible light audio system comprising:
a visible light transmitting apparatus comprising a modulator, a driver, and a light source, the visible light transmitting apparatus being operable to receive an audio source input and being operable to transmit a modulated visible light output corresponding to the audio source input at the light source;
a body-worn or body-carried receiver configured to be worn on a torso of a user having at least one photo detector disposed on a surface of the body-worn or body-carried receiver, the photo detector being operable to receive the modulated visible light output and convert the modulated visible light output into an electrical signal;
a demodulation device being operably engaged with the at least one photo detector to receive the electrical signal via a system bus, the demodulation device being operable to demodulate the electrical signal to produce an audio output corresponding to the compressed audio source input; and,
an audio output device being operably engaged with the demodulation device to deliver an audio output, the audio output device comprising one or more assistive listening devices or ear pieces.

16. The visible light audio system of claim 15 wherein the audio source input comprises a prerecorded message or telecommunications circuit.

17. The visible light audio system of claim 16 further comprising a plurality of visible light transmitting apparatuses being installed in a commercial or residential dwelling, the plurality of visible light transmitting apparatuses being operably engaged over a network.

18. The visible light audio system of claim 17 wherein each visible light transmitting apparatus in the plurality of visible light transmitting apparatuses is configured to transmit a prerecorded message corresponding to a location in the commercial or residential dwelling.

\* \* \* \* \*